United States Patent [19]

Wei

[11] Patent Number: 4,903,107
[45] Date of Patent: Feb. 20, 1990

[54] BURIED OXIDE FIELD ISOLATION STRUCTURE WITH COMPOSITE DIELECTRIC

[75] Inventor: Ching-Yeu Wei, Schenectady, N.Y.

[73] Assignee: General Electric Company, Schenectady, N.Y.

[21] Appl. No.: 246,068

[22] Filed: Sep. 16, 1988

Related U.S. Application Data

[63] Continuation of Ser. No. 947,340, Dec. 29, 1986, abandoned.

[51] Int. Cl.$^4$ ............................................. H01L 29/78
[52] U.S. Cl. ........................................ 357/49; 357/47; 357/54; 357/55; 357/23.11
[58] Field of Search ................... 357/54, 47, 55, 23.11, 357/49

[56] References Cited

U.S. PATENT DOCUMENTS

| | | | |
|---|---|---|---|
| 3,904,450 | 9/1975 | Evans et al. | 357/49 X |
| 3,933,540 | 1/1976 | Kondo et al. | 357/49 X |
| 3,958,040 | 5/1976 | Webb | 357/49 X |
| 4,104,086 | 8/1978 | Bonour et al. | 357/49 X |
| 4,143,455 | 3/1979 | Schwabe et al. | 357/49 X |
| 4,196,440 | 4/1980 | Anantha et al. | 357/35 |
| 4,268,847 | 5/1981 | Kurakami et al. | 357/55 X |
| 4,271,423 | 6/1981 | Kang | 357/55 X |
| 4,333,965 | 6/1982 | Chow et al. | 427/93 |
| 4,509,249 | 4/1985 | Goto et al. | 357/55 X |
| 4,740,827 | 4/1988 | Niitsu et al. | 357/55 X |

OTHER PUBLICATIONS

K. Kasama et al., "A Radiation-Hard Insulator for MOS LSI Device Isolation", *IEEE Transactions on Nuclear Science,* vol. NS-32, No. 6, Dec., 1985, pp. 3965-3970.

K. Kurosawra et al., "A New Bird's Beak Free Field Isolation Technology for VLSI Devices", IEDM, 1981, pp. 384-387.

T. Shibata et al., "A Simplified BOX (Buried-Oxide) Isolation Technology for Megabit Dynamic Memories", IEDM, 1983, pp. 27-30.

*Primary Examiner*—William Mintel
*Attorney, Agent, or Firm*—Marvin Snyder; James C. Davis, Jr.

[57] ABSTRACT

Improved buried oxide (BOX) field isolation in a silicon structure which has a trench with a curved side wall is achieved by employing reactive ion etching or local oxidation of silicon to produce the curved side wall. Electric field enhancement which normally occurs at sharp corners in silicon structures employing conventional buried oxide field isolation is minimized by the curved side wall. The buried oxide field isolation in the silicon structure is provided by chemical vapor deposited SiO$_2$ atop thermally produced SiO$_2$ in the field region.

6 Claims, 9 Drawing Sheets

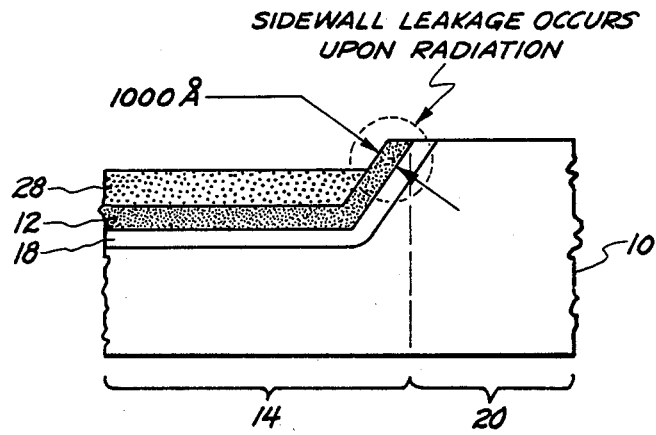
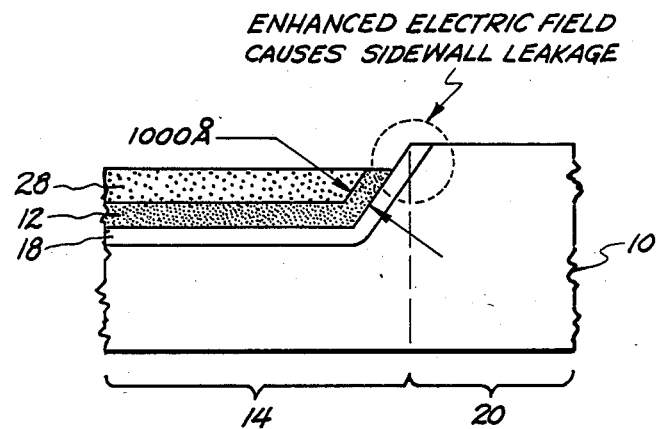
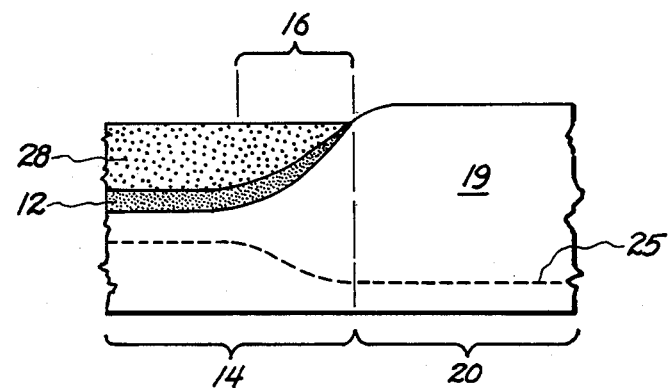

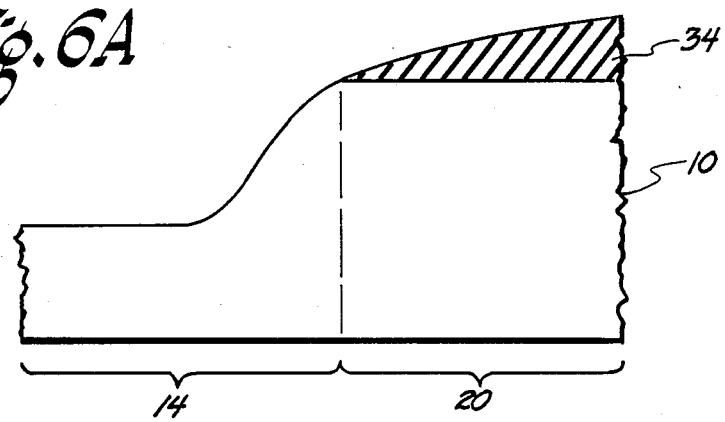
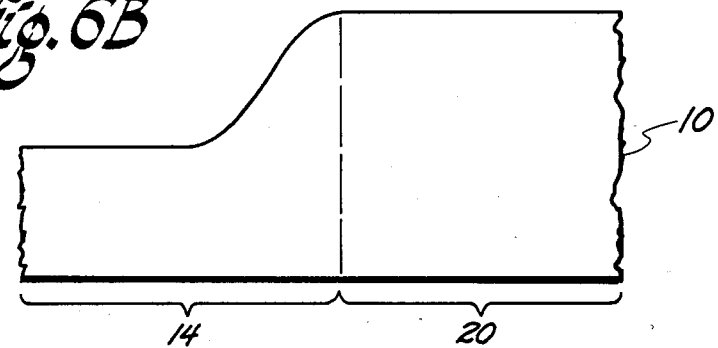

BURIED OXIDE FIELD ISOLATION STRUCTURE WITH COMPOSITE DIELECTRIC

This application is a continuation of application Ser. No. 947,340, filed Dec. 29, 1986, now abandoned.

BACKGROUND OF THE INVENTION

1. Field of the Invention

The present invention generally relates to field isolation technology in silicon semiconductor devices and, more particularly, to techniques which use buried oxide (BOX) field isolation for commercial very large scale integrated (VLSI) circuits. The techniques according to the invention include use of the local oxidation of silicon (LOCOS) process to make the BOX isolation.

2. Description of the Prior Art

The purpose of a field oxide is to electrically isolate various active regions on a silicon chip. LOCOS is a steam process which is used to produce thermal silicon dioxide or $SiO_2$ in the field region of a semiconductor device in a reasonable time. In a steam ambient, thermal oxide is selectively grown in field regions through patterned silicon nitride masks on the semiconductor surface. This process is effective because silicon nitride or $Si_3N_4$ acts as a diffusion block to oxygen. A channel-stop implant, such as boron for n-channel devices, improves the isolation by further raising the field threshold voltage.

Field isolation created by a LOCOS process results in a so-called bird's beak region caused by lateral oxidation of the silicon substrate under the nitride mask. The nitride mask is stripped off after the oxidation. Because radiation hardening of the bird's beak in the LOCOS field oxide is a difficult task which is exacerbated by diffusion of the channel stop during LOCOS processing, workers in the field have been forced to seek alternative processing means.

As one alternative, BOX field isolation technology has been developed for application to VLSI devices. According to Kei Kurosawa, Tadashi Shibata and Hisakazu Iizuka in a paper entitled "A New Bird's-Beak Free Field Isolation Technology for VLSI Devices", presented at the International Electron Devices Meeting (IEDM) 1981, pages 384–387, BOX technology has improved dynamic memory cell density by 80% over that obtainable in devices made by LOCOS because the bird's beak is completely eliminated. T. Shibata, R. Nakayama, K. Kurosawa, S. Onga, M. Konaka and H. Iizuka in a paper entitled "A Simplified BOX (Buried-Oxide) Isolation Technology for Megabit Dynamic Memories", presented at IEDM 9983, pages 27–30, state that BOX structures also have superior electrical characteristics.

The Kurosawa et al. paper describes a two-step oxide-burying process. According to that procedure, regions where active devices will be placed on a silicon substrate are defined by placement of aluminum patterns. The aluminum patterns act as hard masks which protect the active regions from the etching that is subsequently performed. The silicon substrate is first thermally oxidized, and aluminum masks are then placed on the oxide layer thus formed, to define active regions. The wafers are next etched in other than the masked, active regions by reactive ion etching (RIE). The resulting field regions in the silicon wafer are then implanted with boron, again using the aluminum patterns as masks. The trenches are thereafter filled with silicon dioxide by the two-step oxide-burying technique. The active region is thus defined by the aluminum mask and the final structure is free of bird's beak formation. The Kurosawa et al. paper also recognizes the undesirability of a channel leakage current occurring at the side walls of the trenches in the silicon substrate, and eliminates the parasitic channel formation by implanting boron in the walls.

The Shibata et al. paper describes a BOX process for metal oxide semiconductor field effect transistors (MOSFETs) with a simplified sequence of steps. $SiO_2$ masks are used instead of aluminum, followed by taper etching of silicon using RIE to obtain silicon mesas. Boron is then implanted in the field region, and the silicon surfaces in the trench are thermally oxidized. The trench is next filled with chemical vapor deposited (CVD) silicon dioxide. Photoresist patterns are then placed to cover the silicon dioxide in the field areas, and a spin coating of photoresist is placed on top of the photoresist patterns to create a planar, double resist. RIE etchback with the two resist layers being sacrificed completes the process. While this BOX process constitutes a one-step channel filling process rather than a two-step process, the idea of filling trenches with $SiO_2$ is the same in both instances. The Shibata et al. improvements lie in the elimination of aluminum masks and the use of taper etching for facilitating the trench filling process.

U.S. Pat. No. 4,333,965 to Chow et al. discloses another method of reducing lateral field oxidation in the vicinity of the active region. RIE is used in this method as well, but here a mesa is created by removing portions of the substrate and leaving a cap of silicon nitride, silicon dioxide, titanium, and photoresist material on top of the mesa. The substrate is next heated in an oxidizing atmosphere to convert the exposed surfaces in the field regions to silicon dioxide. The cap is then removed. The substrate is heated enough to cover the mesa and side walls with thermally produced $SiO_2$. An etchback procedure is performed to expose the top of the mesa. The active region is defined by the top of the mesa and the field region is defined by the trenches created by etching.

The foregoing prior art procedures all suffer from the drawback of overetching during the etchback procedure. If the BOX process of Kurosawa et al. or Shibata et al. is used, for example, either the CVD deposited $SiO_2$ or both the CVD deposited $SiO_2$ and the thermally produced $SiO_2$ may be overetched. A BOX structure where only the CVD deposited $SiO_2$ is overetched leaves only a thin layer of thermal $SiO_2$ to protect the top corner of the channel side wall against leakage current. Studies have shown that this portion of the side wall is very susceptible to experiencing radiation-induced threshold voltage shift. The electric field in the upper corner of a BOX structure where both the CVD deposited $SiO_2$ and the thermal $SiO_2$ are overetched is greatly enhanced. Thus, both structures experience side wall leakage current, the former after exposure to certain minimum levels of radiation, and the latter without exposure to any radiation at all.

BRIEF SUMMARY OF THE INVENTION

It is therefore an object of the invention to provide a new method of employing BOX field isolation to overcome the difficulties noted in the prior art.

Another object of this invention is to provide BOX field isolation for a silicon substrate which differs from conventional BOX field isolation in the shape of the side wall prevent enhanced electric fields.

Another object of the invention is to provide BOX field isolation which is less sensitive to overetching in the field region.

Still another object of the invention is to provide a method for implementing BOX field isolation which is easily adaptable to commercial manufacturing.

According to a preferred embodiment of the invention, BOX field isolation is achieved in a trench in the silicon substrate and employs a curved side wall, in contrast with conventional BOX field isolation which is achieved in a trench having a side wall that is either tapered or straight. The curved side wall may be produced by an RIE process or a LOCOS process. If the RIE process is used, photoresist and silicon are etched at the same rate. Wet silicon etchant, such as potassium hydroxide, may be applied to further smooth and polish the curved side wall. The photoresist is then removed to leave a silicon structure with a trench having a curved side wall. The standard LOCOS process is a simple way to form a trench with a curved side wall in a silicon substrate. If the LOCOS oxidation process is employed, a structure with thermal oxide on the field region and on a curved bird's beak region is obtained. The LOCOS oxidation is performed on a silicon substrate that has silicon nitride masks placed on top. The silicon substrate regions which are not covered by the silicon nitride masks are thermally oxidized to form a silicon dioxide coating on each which, upon further processing, will become the field regions. Lateral oxidation under the silicon nitride masks is responsible for forming the curved bird's beak region. The regions under the silicon nitride masks which are not oxidized and do not form the bird's beak region become the active regions for semiconductor devices upon further processing. The layers of nitride and thermal oxide are then completely removed, resulting in a silicon structure having a trench with a curved side wall.

The silicon wafer having a trench with a curved side wall made by employing either RIE or LOCOS is thermally oxidized to produce a thin skin of $SiO_2$ in the range of 500 Å to 2000 Å, and preferably about 1000 Å. The field region of the semiconductor device is then implanted with boron dopant. The trench is next filled up by chemical vapor depositing $SiO_2$ in the trench, and the structure is topped with double photoresist planarization layers. The structure, at this time comprising a silicon substrate having a curved side wall, a layer of thermal $SiO_2$, a layer of CVD deposited $SiO_2$, and a double resist layer, is planarized by simultaneously etching the resist and oxide until the resist is removed completely. The oxide layer remaining in the active region is then etched away by RIE. The final position of the field oxide surface is not as critical as if the side wall were straight because the curved side wall minimizes the field enhancement which would occur at a sharp corner.

It is also desirable to seal the side wall with CVD deposited oxide in addition to the thermal oxide in order to avoid side wall leakage current. This is because nonuniformity in the RIE planarization can result in some portions of the side wall not being covered with CVD $SiO_2$. Hence CVD deposited $SiO_2$ is added to cover the silicon substrate, and a photoresist mask is placed over the field and bird's beak regions. The CVD oxide and thermal oxide may then be removed from the active area without etching the field and bird's beak regions.

The structure remaining after removal of the photoresist mask has a radiation-induced threshold voltage shift much less than it would if thermal oxide or CVD oxide were used alone.

The technique according to the present invention is particularly attractive because it is an easier method of producing BOX field isolation in a silicon substrate than heretofore known. Further, electric field enhancement at the sharp corner in prior art BOX field isolation structures is avoided by using a curved side wall.

BRIEF DESCRIPTION OF THE DRAWINGS

The foregoing and other objects, aspects and advantages of the invention may be better understood from the following detailed description of the invention with references to the drawings, in which:

FIG. 4A is a cross-sectional illustration of half of a trench in a semiconductor device with BOX field isolation that has been produced in a conventional manner, with CVD $SiO_2$ having been overetched during RIE etchback;

FIG. 4B is a cross-sectional illustration of half of a trench in a semiconductor device with BOX field isolation that has been produced in a conventional manner, with CVD $SiO_2$ an thermally-produced $SiO_2$ overetched during RIE etchback;

FIG. 5 is a cross-sectional illustration of half of a trench in a semiconductor device with BOX field isolation, in which the trench has a curved side wall according to the invention;

FIGS. 6A and 6B are sequential cross-sectional illustrations of half of a trench in a silicon substrate undergoing a method of creating a curved side wall by using the RIE process according to the invention;

DETAILED DESCRIPTION OF THE PREFERRED EMBODIMENT OF THE INVENTION

Figure 1A:
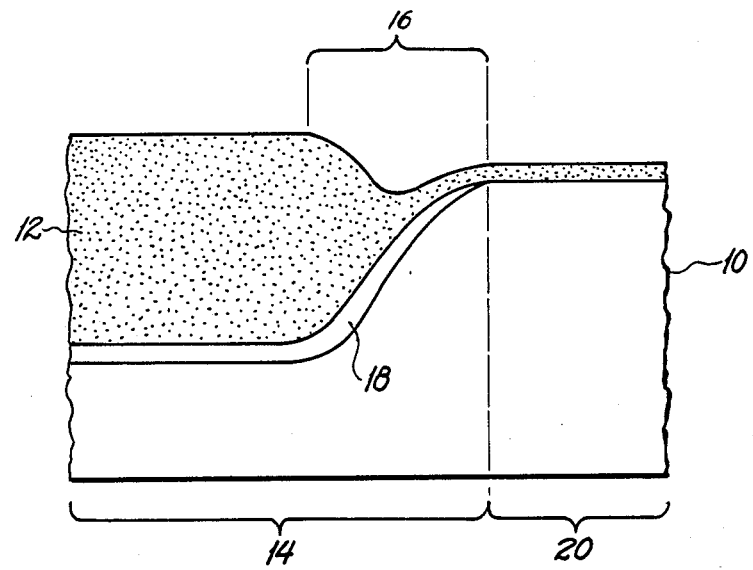
FIG. 1A is a cross-sectional illustration of half of a trench in a semiconductor device made by a prior art LOCOS process in which the field isolation is comprised of thermally-produced $SiO_2$ in the field region and boron ions implanted in the side walls.

In the drawings, like numerals refer to the same or corresponding structures and regions throughout the several figures.

Figure 1B:
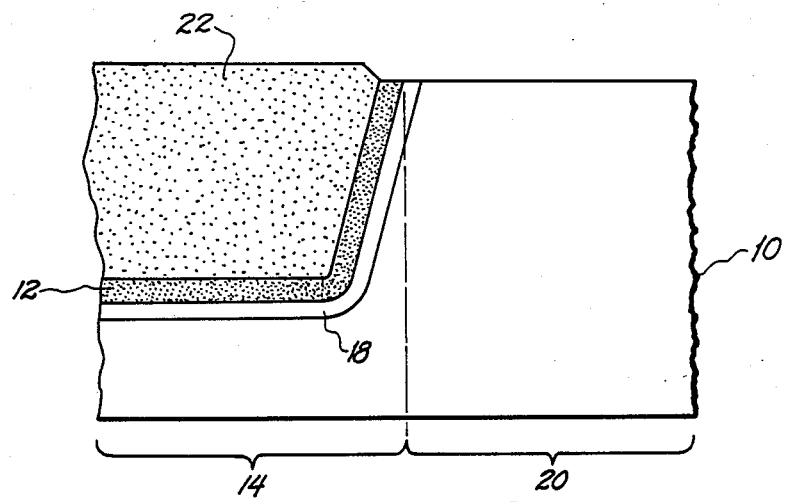
FIG. 1B is a cross-sectional illustration of half of a trench in a semiconductor device made by a conventional BOX field isolation process.

Before describing the details of the invention, it is useful to review briefly the various regions of the semiconductor device to which the invention is related. Particular reference is made to FIGS. 1A and 1B in the drawings. FIG. 1A is a cross-sectional illustration of a semiconductor device in which the field isolation is made by the standard LOCOS process, while FIG. 1B is a cross-sectional illustration of a semiconductor device in which the field isolation is made by the conventional buried oxide technique. Both figures show half of a trench in a silicon substrate 10. The portion of the silicon substrate forming the higher plateau is referred to as the active region 20 because this is the region where the electrical circuits of the semiconductor device are formed. The portion of the silicon substrate forming the lower plateau is referred to as the isolation region or field region 14. The isolation region separates active regions and prevents unintended interchange of electrical signals between two adjacent active devices. The incline in the silicon substrate from the lower plateau to the higher plateau constitutes a side wall of the trench. In the semiconductor device made by the LOCOS process (FIG. 1A), the side wall is curved adjacent active region 20 and exists in what is referred to as the bird's beak region 16. The bird's beak region 16 is formed by lateral oxidation under a silicon nitride mask (not shown). A semiconductor device made by the LOCOS process has thermally-produced silicon dioxide 12 atop field region 14 of substrate 10. In semiconductor devices fabricated by using the BOX technique (FIG. 1B), thermally-produced silicon dioxide 12 is buried under deposited silicon dioxide 22 atop field region 14.

Typically, several active devices occupy the same silicon substrate. Therefore, it is necessary to employ an effective method of isolation which uses as little space as possible. Semiconductor structures fabricated by the BOX technique have been proposed because of the difficulty of radiation hardening the bird's beak region 16 in structures fabricated by the LOCOS process. BOX field isolation has also been proposed for very large scale integrated (VLSI) circuits because of the increased packing density. In devices fabricated by either the LOCOS or BOX process, the more steeply tapered the side wall, or the more closely to vertical the side wall, the less space is required to separate active devices.

Figure 2A:
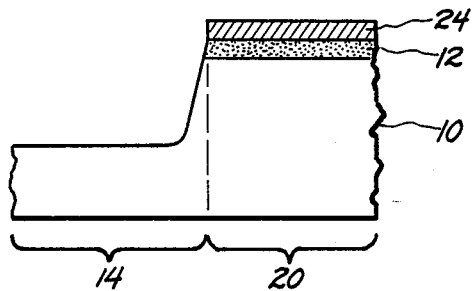
FIGS. 2A through 2G are sequential cross-sectional illustrations of half of a trench in a semiconductor device undergoing a prior art method of producing BOX field isolation with a vertical side wall.
Figure 2B:
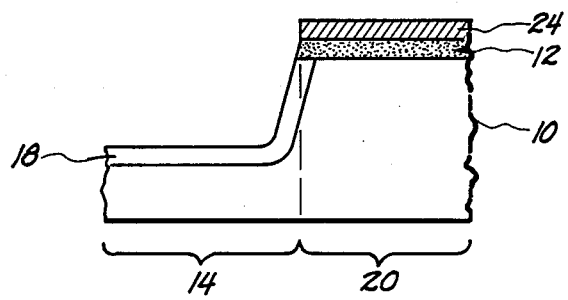
Figure 2C:
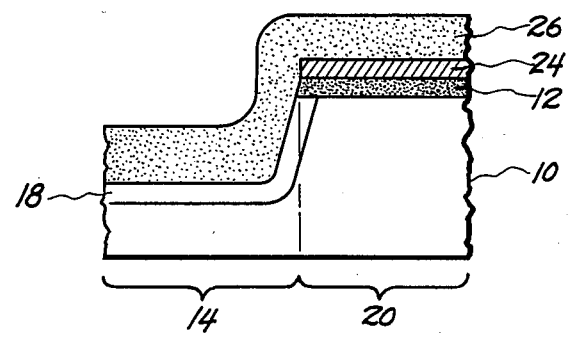
Figure 2D:
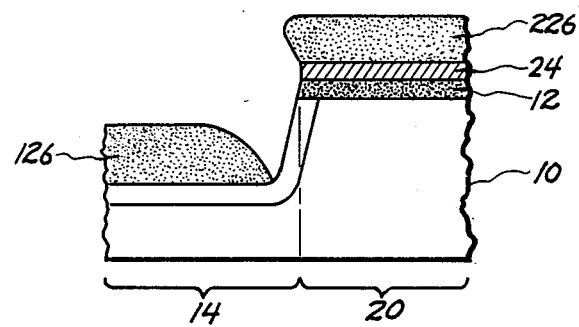
Figure 2E:
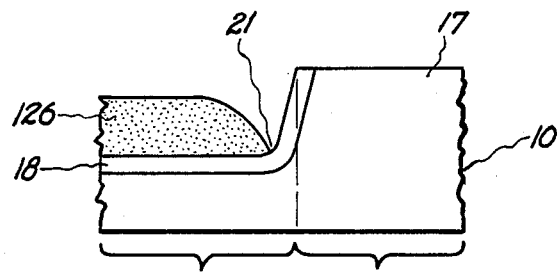
Figure 2F:
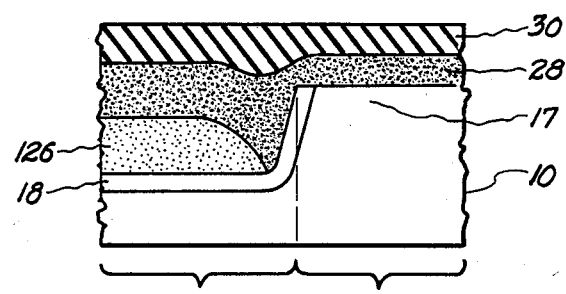
Figure 2G:
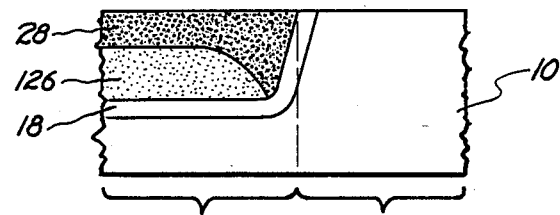

In the aforementioned Kurosawa et al. paper, a two-step oxide-burying process is described in which regions where active devices are to be placed on a silicon substrate are defined by an aluminum mask which protects the active regions from the subsequent etching procedure. The silicon substrate is first thermally oxidized to produce a thin layer of $SiO_2$ over its top surface. The aluminum mask is next placed on the silicon substrate, and the wafer is etched by reactive ion etching to produce the structure shown in cross section in FIG. 2A. FIG. 2A shows an aluminum mask 24 situated atop thermally-produced silicon dioxide 12 on the active region 20 of silicon substrate 10 after undergoing reactive ion etching. The resulting trench in the silicon wafer constitutes a field region and the separation between active regions constitutes field isolation. Each silicon field region is then implanted with boron 18, again using the aluminum mask, as shown in FIG. 2B. The trench is next filled with $SiO_2$ by the two-step oxide-burying technique. The first oxide-burying step is accomplished by plasma-depositing a layer of $SiO_2$ in each trench and on top of the silicon-$SiO_2$-aluminum mesa as shown in FIG. 2C. A lift-off technique which uses the preferential etching characteristics of plasma-deposited $SiO_2$ in buffered HF solution occurring at steep side walls is then used to preferentially etch the plasma-deposited silicon dioxide at the edges of each active region 20, as shown in FIG. 2D. $SiO_2$ is thereby completely removed from the side walls of each trench, leaving $SiO_2$ layer 126 in the trench separated from $SiO_2$ layer 226 on the active region. $SiO_2$ layer 226 is then selectively removed from the top of the mesa by etching the underlying aluminum layer 24 by the process commonly known as the "lift-off" technique. $SiO_2$ layer 12 is thereafter etched away, resulting in the structure shown in FIG. 2E. This structure comprises a silicon substrate with silicon mesas 17 (only one of which is shown) separated by field oxides 126 (only one of which is shown). V-shaped grooves 21 (only one of which is shown) created by the left-off technique separate the silicon mesas from the plasma-deposited field oxides. The second oxide-burying step is performed by first chemical vapor depositing a layer of $SiO_2$ 28 atop the structure comprised of silicon mesas 17 separated by field oxides 126. The CVD $SiO_2$ fills each V-shaped groove 21 and covers the top of each silicon mesa 17 and plasma-deposited field oxide 126, as shown in FIG. 2F, and the structure is next topped off with a planar, spin coated resist layer 30. The resist and CVD oxide layers 28 and 126, respectively, are then both etched at the same rate by RIE in a single operation. The remaining oxide on the active device region 20 is removed by surface etching, resulting in the structure shown in FIG. 2G. The field oxide in the structure shown in FIG. 2G is comprised of plasma-deposited $SiO_2$ 126 and CVD deposited $SiO_2$ 28. The active region has thus been defined by the aluminum mask and the final structure is free of bird's beak formation. The Kurosawa et al. paper also indicates that channel leakage current which would undesirably exist at the side walls of the trenches in the silicon substrate, is eliminated by boron implantation in the walls.

Figure 3A:
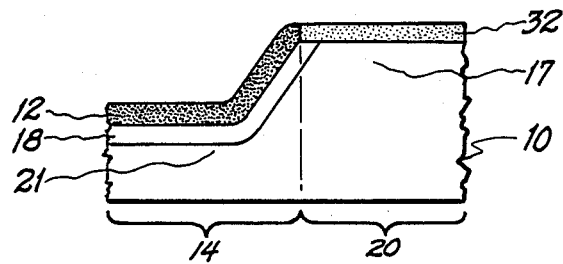
FIGS. 3A through 3D are sequential cross-sectional illustrations of half of a trench in a semiconductor device undergoing another prior art method of producing BOX field isolation with a tapered wall.
Figure 3B:
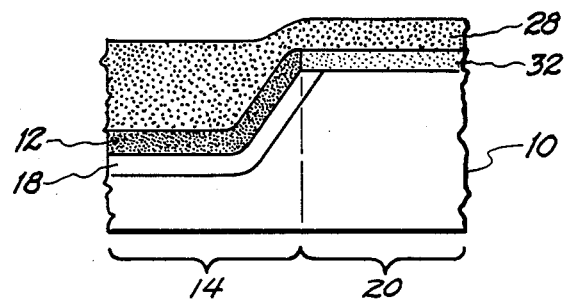
Figure 3C:
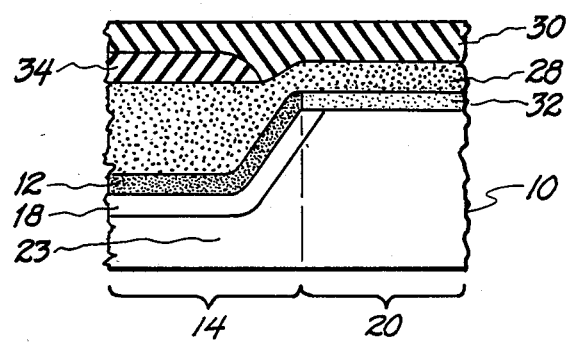
Figure 3D:
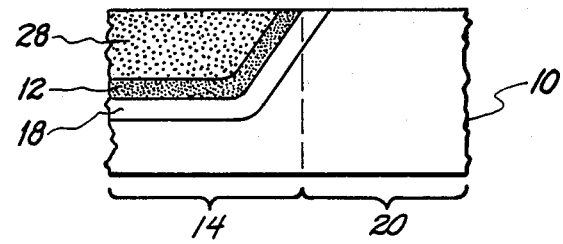

In the BOX process for fabricating metal oxide semiconductor field effect transistors (MOSFETs) with a simplified sequence of steps, described in the aforementioned Shibata et al. paper, and as shown in FIG. 3A, a $SiO_2$ mask 32 is formed, in conventional fashion, atop active region 20 of silicon substrate 10, and substrate 10 is taper-etched by RIE to obtain silicon mesas 17 and 21. Boron 18 is then implanted in the field region, and the silicon surfaces in the trench are thereafter thermally oxidized to form the oxide layer 12. The trench is next filled with CVD $SiO_2$ 28, which also coats silicon dioxide mask 32, as shown in FIG. 3B. Photoresist patterns 34 are then formed to cover CVD $SiO_2$ 28 and thermal $SiO_2$ 12 on mesa 23 of each field region 14, in the manner shown in FIG. 3C. A spin coating of planarizing photoresist 30 is placed on top of the photoresist patterns to produce a double resist having a planar surface. RIE etchback of the silicon dioxide with the two resist layers being sacrificed completes the process, resulting in the structure shown in FIG. 3D.

In using the BOX process as described by Kurosawa et al. or Shibata et al., either the CVD deposited $SiO_2$ or both the CVD deposited $SiO_2$ and the thermally-produced $SiO_2$ may be overetched. FIGS. 4A and 4B illustrate this drawback. A BOX structure where only the CVD deposited $SiO_2$ 28 is overetched leaves only a thin layer of thermal $SiO_2$ to protect the top corner of the channel side wall against leakage current. The encircled portion of FIG. 4A shows the top corner of the channel, which is the region where leakage current is likely to occur. This portion of the side wall is very susceptible to experiencing radiation-induced threshold voltage shift. On the other hand, a BOX structure where both the CVD deposited $SiO_2$ 28 and the thermal $SiO_2$ 12 are overetched experiences a greatly enhanced electric field in the upper corner of the channel. The encircled portion of FIG. 4B shows the region in the top corner of the channel where leakage current is likely to occur. Thus the structures shown in both FIGS. 4A and 4B suffer from side wall leakage current. The structure shown in FIG. 4A will leak after exposure to certain levels of radiation, and the structure shown in FIG. 4B will leak even without exposure to radiation.

The subject invention employs BOX field isolation to avoid the common problem of field enhancement associated with the vertical or steeply tapered side wall and an overetching of the CVD deposited $SiO_2$, or both the CVD deposited $SiO_2$ and thermal $SiO_2$ as depicted in FIGS. 4A and 4B, respectively. If the CVD deposited $SiO_2$ 28 is etched too much by RIE etchback, as shown in FIG. 4A, the top corner of the side wall will only be protected by a 1000 Å layer 18 of thermal $SiO_2$. This portion of the side wall is susceptible to radiation induced threshold voltage shift; that is, side wall leakage will be evident after exposure to mild doses of radiation. If both the CVD deposited $SiO_2$ and thermal $SiO_2$ are etched too much by RIE etchback, as shown in FIG. 4B, the top corner of the side wall will have even less protection and has been known to experience leakage current even without being irradiated.

The new method of reducing or eliminating side wall leakage, described in detail hereinafter, is achieved by eliminating the sharp corner created by the side wall and the active area in conventional semiconductor devices with BOX field isolation. FIG. 5 is a cross-sectional view of half of a trench in a semiconductor device with the inventive BOX field isolation. The trench in field region 14 is separated from active region 20 by a curved side wall. The field oxide above the silicon substrate traversed by the curved side wall may be referred to as bird's beak region 16 because it may be created by the LOCOS process. The curved side wall in FIG. 5 minimizes the field enhancement which would otherwise occur at a sharp corner. The device does not require an extra side wall implant. In the present invention, a retrograde P-well implant 19 in the active region 20 provides sufficient side wall doping. The retrograde P-well 19, having a boundary 25, is made by exposing only the active region 20 to boron doping. The boron doping concentration in the side wall increases toward the field oxide region 14. In general, the radiation-induced threshold voltage along the side wall increases as the total oxide thickness increases. In the present invention, the increased threshold voltage shift has been compensated by the increased threshold voltage along the side wall toward the thick field oxide region 14. Prior art devices which have vertical side walls require a heavy boron side wall doping so as to increase the threshold voltage to compensate for the threshold shift caused by the irradiation. The invention is less susceptible to occurrence of leakage current caused by overetching because the field enhancement which normally occurs at a sharp corner is avoided by the rounded corner.

The curved side wall may be created by either RIE etching or by LOCOS oxidation. FIGS. 6A and 6B are sequential cross-sectional illustrations of half of a trench in a silicon substrate 10 which is created by the RIE etchback procedure. To create the trench in the silicon substrate 10 with a curved side wall, a photoresist layer is first put down over the entire upper surface, and RIE etching of both the substrate and photoresist layer is performed in a single operation, leaving a trench in substrate 10 and a portion 34 of the photoresist layer atop the active region 20 of substrate 10. The remainder 34 of the photoresist layer may then be stripped off the active region 20, leaving the structure shown in FIG. 6B. The corner may then be rounded further by polishing with a wet silicon etchant if required.

Figure 7A:
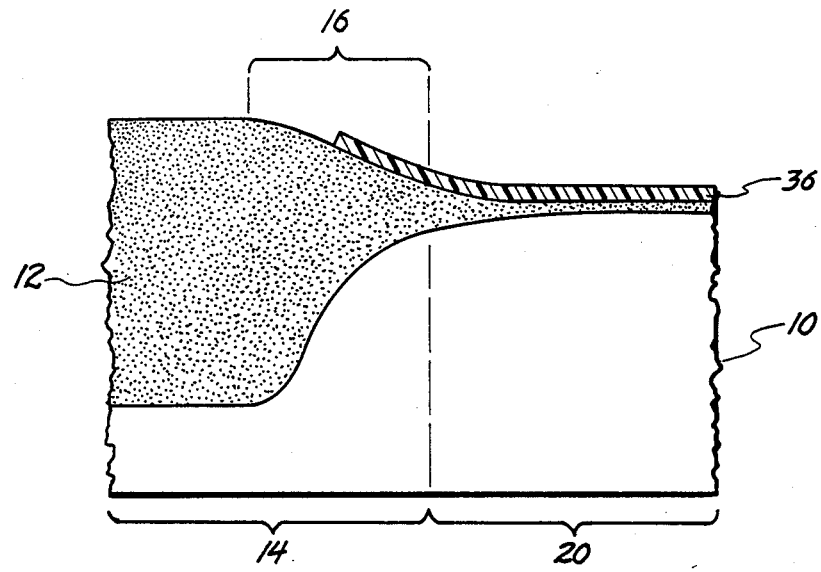
FIGS. 7A and 7B are sequential cross-sectional illustrations of half of a trench in a silicon substrate undergoing a method of creating a curved side wall by using the LOCOS process according to the invention.
Figure 7B:
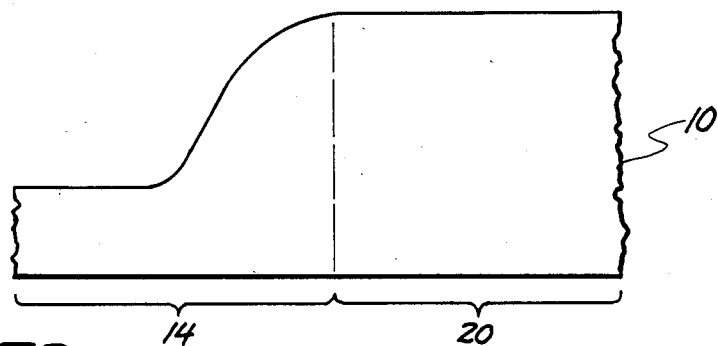

FIGS. 7A and 7B are sequential cross-sectional views showing creation of a trench in a silicon substrate 10 by the LOCOS oxidation procedure. To create the trench with a curved side wall, a mask of silicon nitride 36 is placed on the silicon substrate 10 covering those areas which will become active regions 20, as shown in FIG. 7A, and silicon substrate 10 with silicon nitride mask 36 thereon is subjected to thermal oxidation. $SiO_2$ 12 is thermally grown on silicon substrate 10 by oxidation, creating a field region 14 and an accompanying bird's beak region 16. Field region 14 is created by direct exposure to the oxidizing ambient. Bird's beak region 16 is created by lateral oxidation under silicon nitride mask 36. After oxidation, silicon nitride mask 36 may be removed to expose active region 20. The thermal $SiO_2$ in the trench is then removed to yield a silicon substrate with two plateaus and a curved side wall, as shown in FIG. 7B.

Figure 8A:
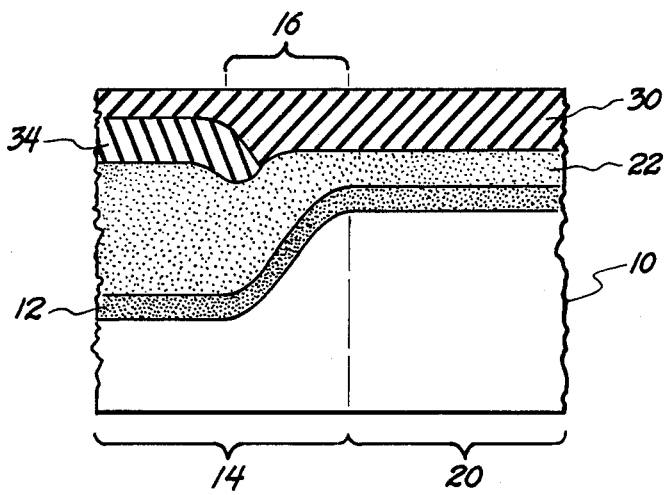
FIGS. 8A through 8C are sequential cross-sectional illustrations of half of a trench in a semiconductor device undergoing a method of forming BOX field isolation according to the invention.
Figure 8B:
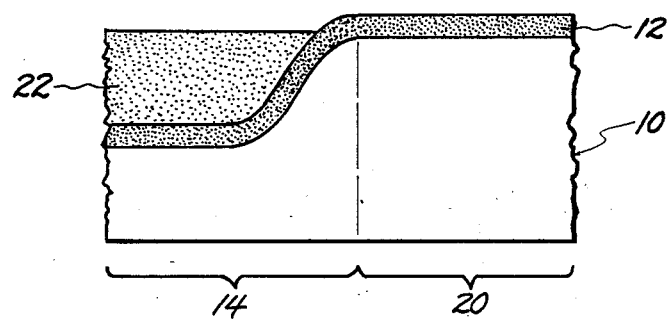
Figure 8C:
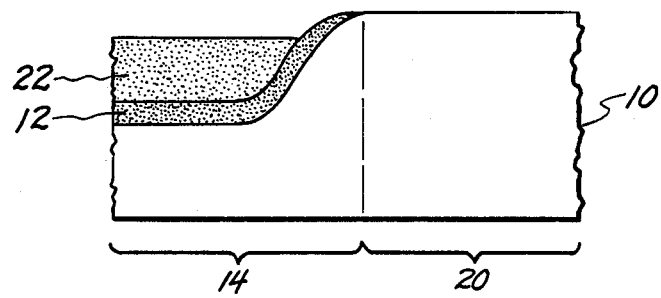

FIGS. 8A through 8C are sequential cross-sectional illustrations of half of a trench in a silicon substrate, which show the final processing steps (starting with a silicon substrate having two plateaus, as in either FIG. 6B or 7B) in providing BOX field isolation with a curved side wall. FIG. 8A is a cross-sectional view of silicon substrate 10 with two plateaus and a curved side wall, as produced by either an RIE etchback procedure or a LOCOS oxidation procedure, with several layers of other materials on top. Specifically, a skin of $SiO_2$ 12 of thickness in the range of 500 °A to 2000 °A, and preferably about 1000 Å, is thermally grown on silicon substrate 10. A layer of CVD $SiO_2$ 22 is deposited on thermal $SiO_2$ 12 to a thickness of about 7000 Å to fill the trench and cover the entire structure. Then a double photoresist mask 34 is applied over the $SiO_2$ atop field region 14 (except in bird's beak area 16) to insure against subsequent, unwanted etching of the field region, and a spin coated photoresist 30 is applied over the entire structure to planarize the structure. The planarized structure is shown in FIG. 8A.

The structure illustrated in FIG. 8B is produced by RIE etching the planarized structure of FIG. 8A at a 1:1 etchback rate between the double photoresist and CVD deposited $SiO_2$ 22. The BOX field isolation structure with a curved side wall, as illustrated in FIG. 8C, is subsequently obtained by placing a photoresist mask (not shown) atop all but active region 20 of the structure shown in FIG. 8B, and then RIE etching the thermal SiO$_2$ 12 off of active region 20. Since the trench side is curved near active area 20, the final position of the surface of the CVD deposited SiO$_2$ 22 is not as critical as in semiconductor devices employing conventional BOX field isolation.

Figure 9A:
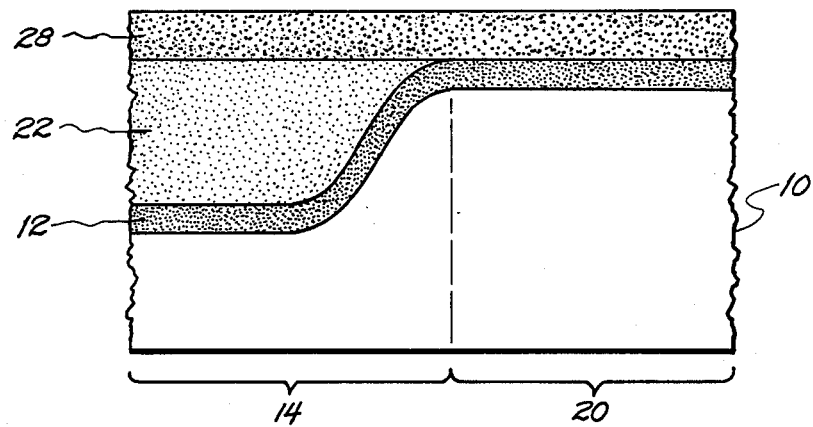
FIGS. 9A and 9B are sequential cross-sectional illustrations of half of a trench in a semiconductor device undergoing another method of forming BOX field isolation according to the invention.
Figure 9B:
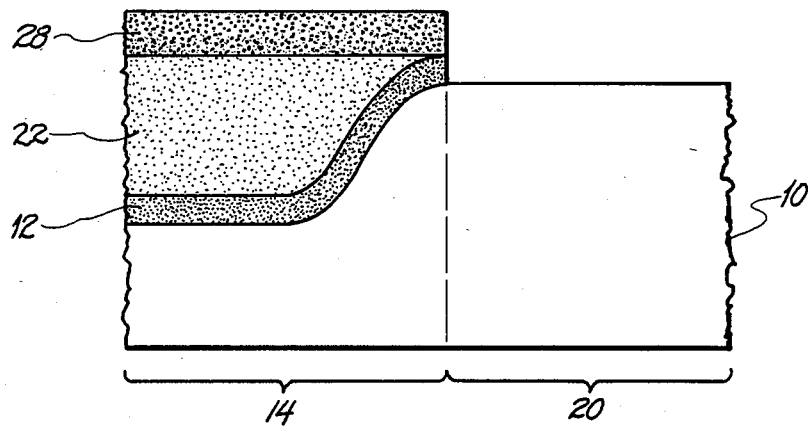

FIGS. 9A and 9B are sequential cross-sectional illustrations of a semiconductor device with BOX field isolation that has a curved side wall being fabricated by a method constituting a modification of the invention as illustrated in FIGS. 8A–8C. Due to unavoidable nonuniformity of the RIE planarization, the top portion of the side wall in the structure shown in FIG. 8C is not covered by CVD oxide at some locations on the silicon substrate. This disadvantage is overcome by the structure of FIG. 9B. Thus, as shown in FIG. 9A, silicon substrate 10 is entirely covered with a thin layer 12 of thermal SiO$_2$, with a layer 22 of CVD deposited SiO$_2$ thereover in the trench. A second layer 28 of CVD deposited SiO$_2$ covers the entire structure. This structure is produced by starting with the structure shown in FIG. 8B and selectively refilling the trench with CVD deposited SiO$_2$ 22. Layer 28 of SiO$_2$ is then CVD deposited over the entire structure to a thickness of 1000 Å to 3000 Å, and preferably about 2000 Å.

The structure illustrated in FIG. 9B represents a modified BOX field isolation structure with a curved side wall. This structure may be produced from that illustrated in FIG. 9A by forming a photoresist mask (not shown) over the oxides in field region 14 and then removing the oxides in active region 20 by RIE or wet etching. The semiconductor device thus produced is relatively insensitive to radiation.

While the invention has been described in terms of the preferred embodiments which utilize methods of providing BOX field isolation in a semiconductor, those skilled in the art will recognize that the specified conditions and parameters may be varied in the practice of the invention within the spirit and scope of the appended claims.

What is claimed is:

1. A buried oxide field isolation structure for a silicon semiconductor device exhibiting a low radiation-induced threshold voltage shift, comprising:
   a silicon substrate layer having an active region and a trench adjacent to said active region, said trench having a side wall curved along a dimension perpendicular to said substrate layer in substantially the entire extent of said side wall so as to form no sharp corners with said active region;
   a thermal SiO$_2$ layer in said trench along the curved side wall; and
   a filler of deposited SiO$_2$ over said thermal SiO$_2$ layer along said side wall and filling up said trench.

2. The buried oxide field isolation structure of claim 1 wherein the thermal SiO$_2$ layer is between 500 Å and 2000 Å thick.

3. The buried oxide field isolation structure of claim 1 further comprising an additional layer of deposited SiO$_2$ between 1000 Å and 3000 Å thick covering the filler of deposited SiO$_2$ and the thermal SiO$_2$ in the trench.

4. The buried oxide field isolation structure of claim 3 wherein said thermal SiO$_2$ layer and said additional layer of deposited SiO$_2$ extend to the active region of said substrate.

5. The buried oxide field isolation structure of claim 3 wherein said thermal SiO$_2$ layer contacts said additional layer of deposited SiO$_2$ beyond the extent of said filler of deposited SiO$_2$.

6. The buried oxide field isolation structure of claim 1 wherein said thermal SiO$_2$ layer extends only to said active region and wherein said filler of deposited SiO$_2$ covers the entire extent of said thermal SiO$_2$ layer along said curved side wall.

* * * * *